US008243864B2

(12) United States Patent
Ciccarelli et al.

(10) Patent No.: US 8,243,864 B2
(45) Date of Patent: Aug. 14, 2012

(54) NOISE REDUCTION FILTERING IN A WIRELESS COMMUNICATION SYSTEM

(75) Inventors: Steven Ciccarelli, Ramona, CA (US); Arun Raghupathy, Bridgewater, NJ (US); Brian C. Banister, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 965 days.

(21) Appl. No.: 10/994,012

(22) Filed: Nov. 19, 2004

(65) Prior Publication Data

US 2006/0109939 A1    May 25, 2006

(51) Int. Cl.
  *H04B 1/10*    (2006.01)
(52) U.S. Cl. ....... 375/350; 375/346; 455/63.1; 455/266; 455/296; 455/303; 455/306
(58) Field of Classification Search .................. 375/350, 375/47, 147, 316, 130, 240, 13, 345–346; 455/63.1, 266, 296, 303, 306
  See application file for complete search history.

(56) References Cited

U.S. PATENT DOCUMENTS

| | | | | |
|---|---|---|---|---|
| 4,549,312 A | | 10/1985 | Michaels et al. | 455/311 |
| 4,563,651 A | * | 1/1986 | Ohta et al. | 329/318 |
| 5,151,919 A | * | 9/1992 | Dent | 370/209 |
| 5,339,455 A | * | 8/1994 | Vogt et al. | 455/266 |
| 5,442,353 A | * | 8/1995 | Jackson | 341/143 |
| 5,760,702 A | * | 6/1998 | Ito et al. | 340/4.2 |
| 5,809,399 A | * | 9/1998 | Tuutijarvi et al. | 455/63.1 |
| 6,005,506 A | * | 12/1999 | Bazarjani et al. | 341/143 |
| 6,047,171 A | * | 4/2000 | Khayrallah et al. | 455/266 |
| 6,178,314 B1 | * | 1/2001 | Whikehart et al. | 455/188.1 |
| 6,577,258 B2 | * | 6/2003 | Ruha et al. | 341/143 |
| 6,670,901 B2 | | 12/2003 | Brueske et al. | |
| 6,901,243 B2 | * | 5/2005 | Jayaraman et al. | 455/63.1 |

(Continued)

FOREIGN PATENT DOCUMENTS

DE    2751223    5/1979

(Continued)

OTHER PUBLICATIONS

International Search Report—PCT/US02/34333—International Search Authority—European Patent Office—Feb. 13, 2003.

(Continued)

*Primary Examiner* — Sam K Ahn
*Assistant Examiner* — Sophia Vlahos
(74) *Attorney, Agent, or Firm* — Howard H. Seo; Ramin Mobarhan

(57) ABSTRACT

A technique for noise reduction in a wireless communication system uses controllable bandwidth filters (120) to filter a received signal. In a typical implementation, the filters (120) are used at baseband frequencies. A measurement (RSSI) is indicative of the strength of the received signal. A control circuit (144) generates a control signal (146) to control the bandwidth of the filters (120). If the received signal strength is above a first threshold, a wider bandwidth may be used for the filters (120). If the received signal is below a second threshold, the control circuit (144) generates the control signal (146) to set the filters (120) to a more narrow bandwidth. The system (100) may also be used with digital filters (150, 152) following digitization by analog to digital converters (ADCs) (130, 132). The system (100) is particularly well-suited for operation with noise-shaped ADCs (130, 132), such as Delta-Sigma converters.

42 Claims, 7 Drawing Sheets

U.S. PATENT DOCUMENTS

| | | | |
|---|---|---|---|
| 6,985,709 B2 * | 1/2006 | Perets | 455/266 |
| 7,171,185 B2 * | 1/2007 | Matsumoto et al. | 455/324 |
| 2001/0050585 A1 * | 12/2001 | Carr | 327/277 |
| 2003/0081706 A1 | 5/2003 | Ciccarelli et al. | 375/350 |
| 2003/0087622 A1 * | 5/2003 | Jayaraman et al. | 455/307 |
| 2004/0017859 A1 * | 1/2004 | Sills et al. | 375/296 |

FOREIGN PATENT DOCUMENTS

| | | |
|---|---|---|
| EP | 0714181 A1 | 5/1996 |
| EP | 0722226 A1 | 7/1996 |
| JP | 02170626 | 7/1990 |
| JP | 05336187 | 12/1993 |
| JP | 10173551 | 6/1998 |
| JP | 11205204 | 7/1999 |
| JP | 11298344 | 10/1999 |
| JP | 2001257630 A | 9/2001 |
| JP | 2004260528 | 9/2004 |
| RU | 2097922 | 11/1997 |
| RU | 96106603 | 7/1998 |
| WO | WO9534962 A1 | 12/1995 |
| WO | WO0165631 A1 | 9/2001 |
| WO | 0243263 | 5/2002 |
| WO | WO03036802 | 5/2003 |

OTHER PUBLICATIONS

International Search Report—PCT/US05/041848, International Search Authority—European Patent Office—Mar. 6, 2006.
Written Opinion—PCT/US05/041848, International Search Authority—European Patent Office—Mar. 6, 2006.

* cited by examiner

NOISE REDUCTION FILTERING IN A WIRELESS COMMUNICATION SYSTEM

BACKGROUND

I. Field

The present invention relates generally to wireless communication and, more particularly, to an apparatus and method for filtering baseband signals in a wireless communication system.

II. Related Art

Wireless communication systems have increased in number and complexity in recent years. It is common for a plurality of wireless service providers to operate in the same geographic region with overlapping areas of coverage. Because of the increased number of wireless service providers and increased usage, portions of the frequency spectrum allocated to wireless service are often utilized to their capacity or beyond.

A code division multiple access (CDMA) wireless system has a significant capacity because multiple users can simultaneously communicate on the same radio frequency (RF) channel by digitally encoding each transmission using channelization codes. An RF channel refers to a portion of the frequency spectrum. The channelization codes, which are sometimes referred to as orthogonal codes, encode the transmission for each wireless communication device so that a transmission for a given wireless communication device can be recovered by that device while the same transmission appears as noise to other wireless communication devices. Thus, a CDMA system allows multiple users to operate simultaneously on the same RF channel.

Within a particular geographical locale, multiple base transceiver systems (BTSs) may operate on different RF channels so as to minimize interference with adjacent areas of coverage. In many wireless communication systems, there is a guard band or portion of the frequency spectrum separating the RF channels to provide further protection against interference between BTSs.

However, some wireless communication systems do not have an adequate guard band or have no guard band at all. This operating scenario may permit interference to occur between BTSs that are operating on adjacent RF channels.

Present wireless communication systems are not always capable of dealing with such adjacent channel interference. Therefore, it can be appreciated that there is a significant need for an apparatus and method of filtering that enhance operation of wireless communication systems.

SUMMARY

An apparatus and method for performing filtering in a wireless communication system are described herein. A received signal at a wireless communication device is processed (e.g., filtered, amplified, and frequency downconverted) by an RF unit to obtain baseband signals. The baseband signals are further filtered by analog and/or digital filters, digitized by analog-to-digital converters (ADCs), and processed (e.g., demodulated and decoded) to obtain decoded data. In general, it is desirable to adjust the frequency response (e.g., bandwidth, filter order, and so on) of the filters such that the signal-to-noise ratio (SNR) of the filtered signals, after all of the filtering at the wireless device, is maximized. The SNR is dependent on the signal and noise levels. The signal level of the received signal can vary over a wide range. The noise in the filtered signals can come from various sources such as channel noise, receiver noise, quantization noise, and inter-chip interference (ICI), all of which are described below.

The frequency response (e.g., bandwidth) of the filter may be adjusted based on one or more criteria such as desired signal strength, undesired signal strength, and so on. In one embodiment, the filter bandwidth is adjusted based on received (or desired) signal strength, which is indicative of the signal strength of desired signal components in the received signal. (The desired signal components are inband signal components within a selected RF channel.) The filter bandwidth may be reduced if the received signal strength is below a first threshold and widened if the received signal strength exceeds a second threshold. In another embodiment, the filter bandwidth is adjusted based on the undesired signal strength, which is indicative of the signal strength of undesired signal components (or "jammers") in the received signal. (The undesired signal components are out-of-band signal components outside of the selected RF channel.) The filter bandwidth may be reduced if the undesired signal strength exceeds a predetermined threshold and widened if the undesired signal strength falls below this threshold. The filter bandwidth may also be adjusted based on a combination of criteria, as described below.

Each filter bandwidth setting is typically associated with a different delay. To avoid disturbing the timing of the received signal, which may be important for some wireless communication systems such as a CDMA system in order to avoid performance degradation, adjustable delay units may be provided in the signal path. These delay units are adjusted simultaneously with the filters so that the overall delay of both the filters and the delay units is maintained approximately constant even when the filters are adjusted.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout and wherein.

DETAILED DESCRIPTION

The present invention is directed to techniques for filtering baseband signals and improving the reliability of wireless communications. In an embodiment, the signal strength of a received signal is measured. When the received signal is at a low signal level, the bandwidth of a filter may be reduced. The reduction in the bandwidth reduces the noise bandwidth and increases the rejection of adjacent channels. Conversely, when the received signal strength is at a high signal level, the bandwidth of the filter may be widened to take advantage of the greater signal strength.

A wireless communication device has a radio frequency (RF) unit that conditions (e.g., filters, low noise amplifies, frequency downconverts, and so on) the received signal at a selected RF channel. The portion of the spectrum available for wireless communication may be apportioned into a plurality of RF channels, each having a bandwidth designated by industry standard.

The wireless communication device may implement a super-heterodyne receiver architecture or a direct-to-baseband receiver architecture. For the super-heterodyne receiver architecture, the received signal is mixed or translated from radio frequency (RF) down to an intermediate frequency (IF) in one frequency downconversion stage, and then from the intermediate frequency down to baseband frequency (e.g., DC or near DC) in another frequency downconversion stage. Additional amplification and/or filtering may be performed at IF. For the direct-to-baseband receiver architecture, which is becoming more prevalent in wireless communication devices, particularly in a CDMA wireless communication device, the received signal is mixed or translated directly from radio frequency down to baseband frequency. For clarity, the implementations illustrated herein are directed to a CDMA wireless device that uses the direct-to-baseband receiver architecture. However, those skilled in the art will recognize that the principles of the present invention are applicable to wireless communication systems other than a CDMA system and to receiver architectures that do not utilize direct-to-baseband conversion.

Figure 1:
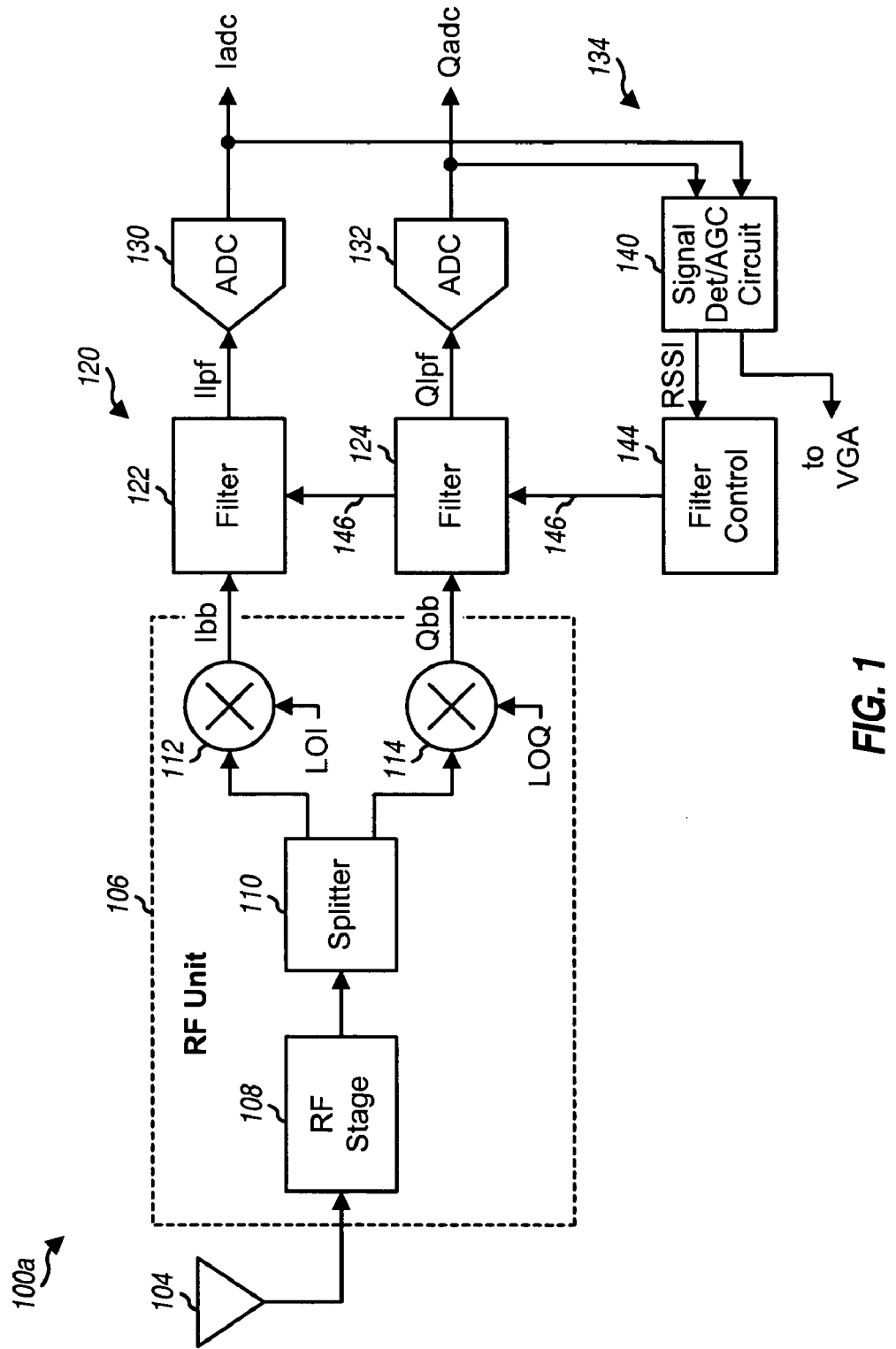
FIG. 1 shows a wireless communication device that implements an embodiment of the present invention.

FIG. 1 shows a block diagram of a wireless communication device 100a that implements an embodiment of the present invention. Wireless device 100a includes an RF unit 106, which is coupled to an antenna 104. RF unit 106 includes an RF stage 108, a splitter 110, and down-mixers 112 and 114. RF stage 108 may include amplifiers and/or filters used to amplify and filter the received signal from antenna 104.

RF stage 108 provides a conditioned RF signal to splitter 110, which splits this RF signal into two identical signals for subsequent quadrature downconversion. The two identical signals from splitter 110 are provided to down-mixers 112 and 114. A down-mixer receives a radio frequency signal and a local oscillator (LO) signal as inputs and generates a down-converted signal containing signal components at the sum and difference frequencies of the two input signals. Down-mixers 112 and 114 are identical in operation except for the phases of their local oscillator signals. The local oscillator signal provided to down-mixer 112 is designated as an inphase local oscillator (LOI) signal, while the local oscillator signal provided to down-mixer 114 is designated as a quadrature local oscillator (LOQ) signal. The LOI and LOQ signals have the same frequency but have a phase offset of 90° with respect to each other. Therefore, the outputs of down-mixers 112 and 114 are quadrature baseband signals designated as Ibb and Qbb, respectively. As noted above, the wireless device shown in FIG. 1 uses the direct-to-baseband receiver architecture. Accordingly, the LOI and LOQ signals mix the received signal directly from a selected RF channel down to baseband frequency. RF channel selection is performed by controlling the frequency of the LOI and LOQ signals.

Down-mixers 112 and 114 provide the inphase and quadrature baseband signals to a filter stage 120, which comprises filters 122 and 124. In a conventional design, filters 122 and 124 may simply be low-pass filters having a fixed bandwidth. However, in wireless device 100a, filters 122 and 124 have variable frequency responses (e.g., variable bandwidth, shape filter order, and so on). As will be described in greater detail below, the bandwidth of filters 122 and 124 is adjusted based on the strength of the received signal and/or other criteria.

Filters 122 and 124 may function as anti-aliasing filters in addition to the variable bandwidth filter function of the present invention. Filters 122 and 124 provide lowpass filtered signals, which are analog baseband signals and designated as Ilpf and Qlpf, to analog-to-digital converters (ADCs) 130 and 132, respectively.

ADCs 130 and 132 convert the analog baseband signals from filters 122 and 124 to digital form and provide samples for subsequent processing. The operation of ADCs 130 and 132 is known in the art. Although any type of ADC may be used to implement ADCs 130 and 132, the filtering technique described herein is well suited for use in conjunction with high dynamic range noise-shaped ADCs, such as a Delta-Sigma ADC, or other noise-shaped ADCs. However, the filtering technique is not limited to any specific type of ADCs. Additional signal processing (e.g., demodulation and decoding) is performed on the samples to obtain decoded data. This signal processing is known in the art and not described herein.

The samples from ADCs 130 and 132 are also used for an automatic gain control (AGC) loop 134. AGC loop 134 generates a gain control signal that controls the gain of a variable gain amplifier (VGA) (not shown in FIG. 1) so that the amplitude of the analog baseband signals provided to ADCs 130 and 132 is at the proper level. This then improves the performance of the conversion process by the ADCs.

The samples from ADCs 130 and 132 are provided to inputs of a signal detector/AGC circuit 140. AGC circuit 140 contains a number of components that are well known in the art. For example, AGC circuit 140 may include a logarithmic converter so that the gain of the VGA is controlled in decibels (dB) instead of linearly. AGC circuit 140 may also include an integrator to control the loop response time, a linearizer to provide correction factors for non-linear responses of gain controls, and so on. The linearizer provides correction factors so as to linearize the control voltage of the VGA. The VGA may be a standalone device inserted, for example, between RF stage 108 and splitter 110. Alternatively, the VGA may reside within and be an integral part of RF stage 108. The gain of the VGA may be continuously adjustable or may be adjustable in discrete steps. Other components may also be part of AGC circuit 140 and AGC loop 134, as is known in the art.

Signal detector/AGC circuit 140 also provides a measure of the received signal strength, which is the signal strength of the desired signal components. In wireless communication systems, this level is sometimes referred to as a received signal strength indicator (RSSI). In addition to control of the VGA, the RSSI from AGC circuit 140 is provided to a filter control unit 144. Filter control unit 144 uses the RSSI to control the bandwidth of filters 122 and 124. Filter control unit 144 generates a filter control signal 146 that is provided to filters 122 and 124 and used to control the bandwidth of these filters. Filter control signal 146 may take a variety of forms. For example, filter control signal 146 may be a serial bus interface (SBI) data word, a digital control signal (with one or more bits), an analog control voltage, and so on. The implementation details of filter control signal 146 may be carried out by one skilled in the art based on the teachings contained herein.

Wireless communication device 100a may be designed to operate on a received signal that may vary over a large range of signal levels (e.g., 80 dB or more for CDMA). This received signal level range or input power range can be divided into multiple subranges. The power level that delineates two adjacent subranges is referred to as a power threshold, a signal threshold, or simply a threshold. Each subrange may be referred to as a "power regime". The filter bandwidth can be adjusted based on the power regime of the received signal.

In an embodiment, the entire input power range is divided into three power regimes—low/weak, intermediate, and high/ strong power regimes. These three power regimes are delineated by two thresholds—a first threshold (Th1) and a second threshold (Th2). However, the entire input power range may be divided into any number of power regimes.

In general, it is desirable to adjust the frequency response (e.g., bandwidth, filter order, and so on) of the filters such that the SNR of the filtered signals, after all of the filtering at the wireless device, is maximized. The SNR is dependent on the signal and noise levels. The signal level of the received signal can vary over a wide range, as described above. The noise in the filtered signals can come from various sources such as channel noise, receiver noise, quantization noise, and ICI. Channel noise includes noise and interference in the wireless channel (e.g., interference from RF signals in adjacent RF channels). Receiver noise includes noise due to circuitry in the receive path (e.g., noise generated by RF unit 106). Quantization noise results from using ADCs 130 and 132 to digitize continuous analog baseband signals into digital samples having discrete values. ICI is distortion generated by a chip in a signal acting as distortion to one or more subsequent chips in the signal. This distortion degrades performance by impacting the ability to correctly detect the received chips. ICI generally increases as the filter bandwidth is narrowed.

The filter bandwidth affects the various types of noise in the filtered signals. A narrow filter bandwidth removes more channel noise, provides more adjacent channel interference rejection, removes more quantization noise (if the filtering is performed after the ADCs), but increases ICI. A wide filter bandwidth passes more channel noise, provides less adjacent channel interference rejection, removes less quantization noise, but reduces ICI.

When the received signal strength is low or weak, it is often desirable to reduce the filter bandwidth in order to reduce channel noise and quantization noise. Since ICI is proportional to the received signal strength, the amount of distortion due to ICI is typically small in comparison to the other types of noise when the received signal strength is low. Thus, performance can typically be improved by reducing the filter bandwidth for low received signal strength.

Conversely, when the received signal strength is high, it is often desirable to widen the filter bandwidth. The channel noise and quantization noise are typically small in comparison to ICI when the received signal strength is high. A filter bandwidth matched to the bandwidth of the received signal can minimize ICI and the overall noise. Thus, performance can typically be improved by increasing the filter bandwidth for high received signal strength.

Table 1 shows exemplary filter bandwidth settings for different received signal strength conditions. The normal bandwidth is wider than the intermediate bandwidth, which is wider than the narrow bandwidth. The filter bandwidth may refer to the 3 dB bandwidth or the equivalent noise bandwidth, both of which are known in the art. The settings in Table 1 are described in detail below.

TABLE 1

| Filter Setting | Signal Strength | Condition | Objective |
|---|---|---|---|
| Narrow | Weak | RSSI < Th2 | Improve adjacent channel interference rejection |
| Intermediate | Intermediate | Th1 > RSSI > Th2 | Optimize noise and distortion |
| Normal | Strong | RSSI > Th1 | Low ICI |

In an embodiment, filter control unit 144 generates filter control signal 146 to maintain the normal bandwidth for filters 122 and 124 when the received signal strength (e.g., RSSI) is above the first threshold (Th1). The normal bandwidth may be set equal to the bandwidth of a filter in a conventional CDMA system, which may be half of the RF channel bandwidth. (The RF channel bandwidth is 1.2288 MHz for an IS-95 CDMA system.) In the presence of a relatively strong received signal, it is desirable to increase the bandwidth of filters 122 and 124 in order to capture as much of the signal energy as possible and minimize ICI.

In contrast, when the received signal strength (e.g., RSSI) is low, it may be desirable to reduce the bandwidth of filters 122 and 124. In an embodiment, if the RSSI is below the second threshold (Th2), filter control signal 146 sets filters 122 and 124 to the narrow bandwidth. The reduction in bandwidth reduces the noise bandwidth and also improves adjacent channel interference rejection.

The intermediate bandwidth may be used for filters 122 and 124 if the received signal strength (e.g., RSSI) is above the second threshold, but below the first threshold. As described below, the intermediate bandwidth may be selected to optimize noise and distortion. In an alternative embodiment, filters 122 and 124 may have a continuously variable bandwidth that decreases as the received signal strength (e.g., RSSI) decreases.

Figure 2A:
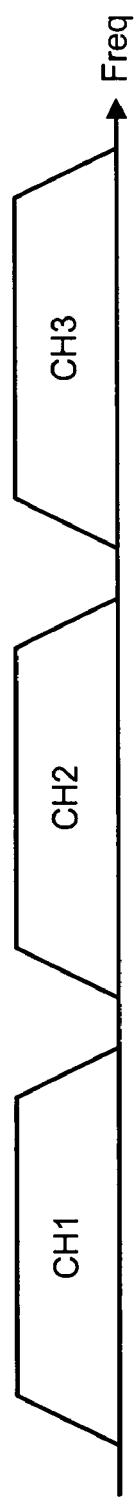
FIGS. 2A-2C show sample frequency spectra illustrating the filtering technique of the present invention.

Bandwidth reduction is particularly important in a wireless communication system in which no guard band or inadequate guard bands have been provided. This concept is illustrated in the sample spectra shown in FIGS. 2A-2C. In FIG. 2A, a spectrum with adequate guard band separation between adjacent RF channels is illustrated. The guard band separation allows an RF signal on one RF channel to roll off without interfering with the RF signals on adjacent RF channels.

Figure 2B:
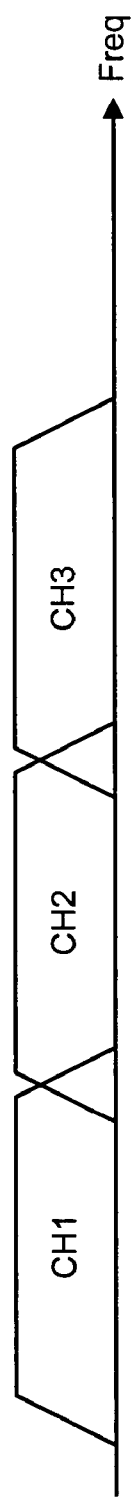

FIG. 2B illustrates a spectrum in which no guard bands are provided. As can be seen from FIG. 2B, the overlap between the RF signals on adjacent RF channels CH1 and CH2 is apparent. Similar overlap occurs between the RF signals on adjacent RF channels CH2 and CH3. The overlap between the RF signals causes interference, which decreases the SNR of each affected RF signal.

Figure 2C:
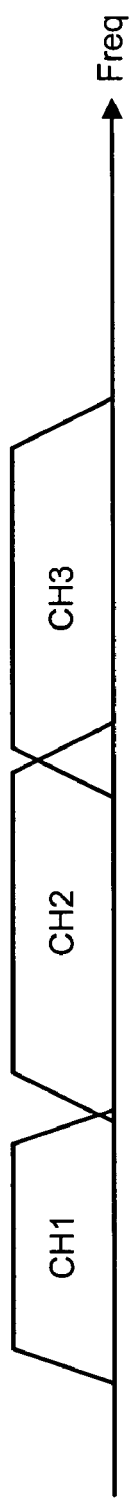

FIG. 2C illustrates the use of a variable bandwidth filter on, by way of example, RF channel CH1. The RF signal on RF channel CH1 is filtered with the narrow bandwidth. As is apparent from FIG. 2C, the narrow bandwidth filters out a portion of the spectrum of the RF signal on RF channel CH2 that would otherwise overlap and interfere with the RF signal on RF channel CH1. The result is an increase in adjacent channel interference rejection for RF channel CH1.

The embodiment of FIG. 1 illustrates an analog implementation for filter stage 120. However, wireless device 100a may also implement digital filters or a combination of analog and digital filters.

Figure 3:
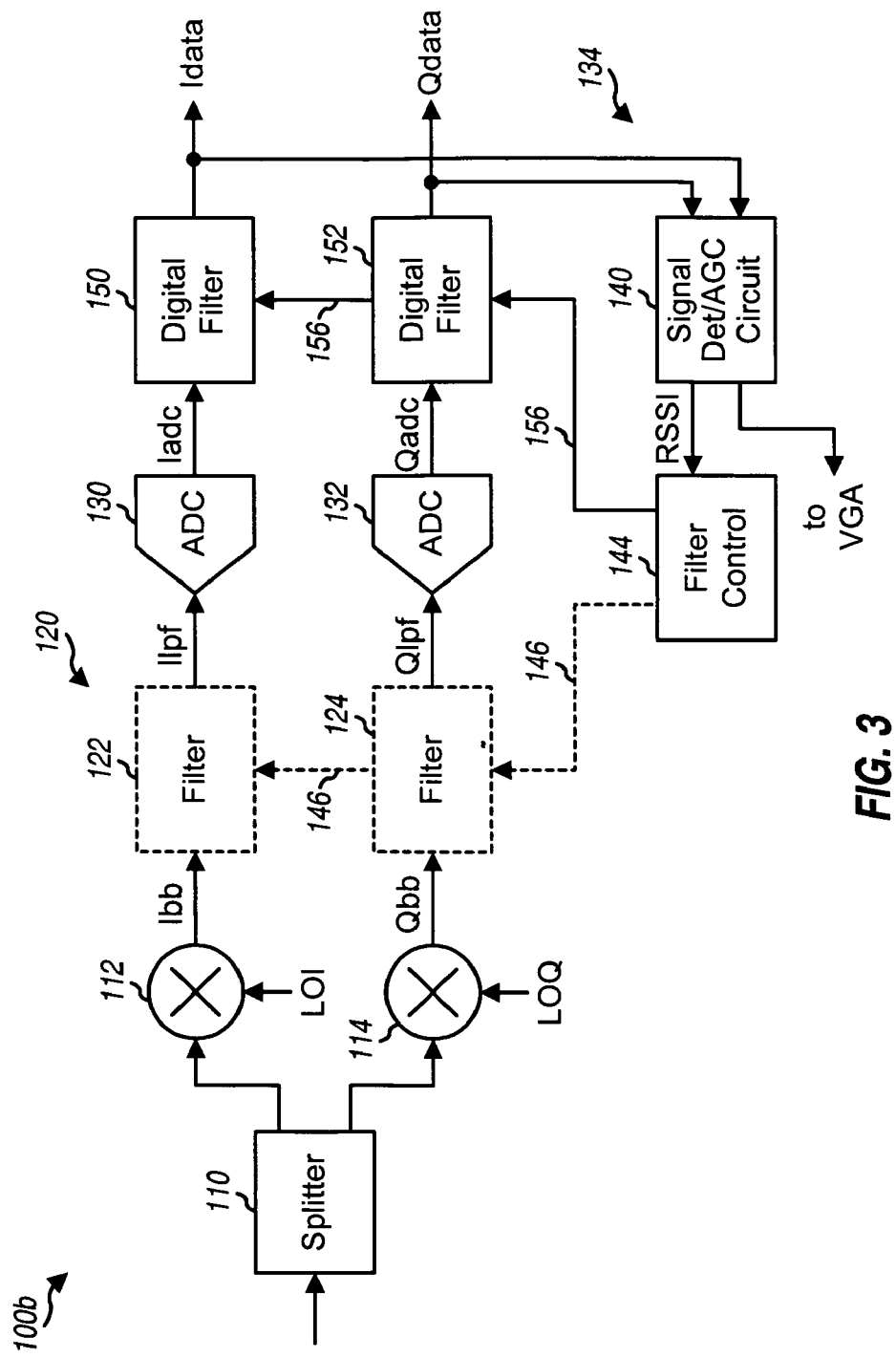
FIG. 3 shows a wireless communication device that implements another embodiment of the present invention.

FIG. 3 shows a block diagram of a wireless communication device 100b that implements another embodiment of the present invention. As illustrated in FIG. 3, the samples from ADCs 130 and 132 are provided to digital filters 150 and 152, respectively. Digital filters 150 and 152 operate in a manner similar to that described above for filters 122 and 124. That is, digital filters 150 and 152 may be set to the normal bandwidth when the received signal strength is above the first threshold (Th1).

When the received signal strength is below the first threshold, filter control unit 144 generates a filter control signal 156 to reduce the bandwidth of the digital filters 150 and 152. Digital filters 150 and 152 may be implemented as part of a digital signal processor (DSP) (not shown) or a central processing unit (CPU) (not shown).

Filter control signal 156 is illustrated in FIG. 3 as a single control line. However, digital filters 150 and 152 may be implemented by providing new filter coefficients to alter the frequency response (e.g., bandwidth, shape, and/or order) of digital filters 150 and 152. Thus, filter control signal 156 may comprise coefficients for the digital filters in order to accomplish the desired frequency response.

In addition to digital filters 150 and 152, wireless device 100b may also include analog filters 122 and 124. Filters 122 and 124 are illustrated in FIG. 3 with dashed lines to indicate that they are optional for variable bandwidth operation. However, the combination of analog filters 122 and 124 and digital filters 150 and 152 can provide additional filtering that may be desirable in certain scenarios. Filter control signal 146 may be implemented in analog or digital form, as described above. Regardless of whether wireless device 100b is implemented with analog filters 122 and 124, digital filters 150 and 152, or a combination of analog and digital filters, the adjustment of the filter bandwidth based on the received signal strength improves the performance of wireless device 100b.

Wireless device 100b reduces the bandwidth of the filters (analog filters 122 and 124 and/or digital filters 150 and 152) based on the received signal level. In one implementation, the bandwidth of the filters is reduced when the received signal provided to RF stage 108 (See FIG. 1) is at sensitivity. The term "at sensitivity," refers to the lowest discernible signal that may be processed by the wireless communication device. The determination of a receiver at sensitivity is known in the art and not described herein.

When the received signal for wireless device 100b is at sensitivity, the dominating noise sources are thermal noise and quantization noise from ADCs 130 and 132. When the received signal is at sensitivity, wireless device 100b is operating below the second threshold (Th2). In this low power regime, the bandwidth of the filters (i.e., analog filters 122 and 124 and/or digital filters 150 and 152) is reduced in order to attenuate noise in the filtered samples Idata and Qdata.

Figure 4A:
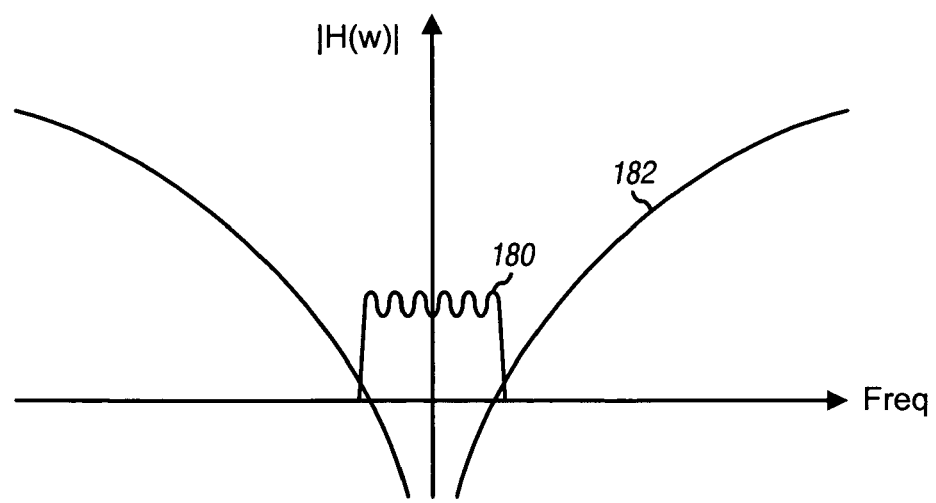
FIGS. 4A and 4B show sample frequency spectra illustrating the filtering technique with a noise-shaped ADC.

As previously noted, ADCs 130 and 132 may be a Delta-Sigma type, or some other type, which spectrally shapes the quantization noise such that the noise is low inband but rapidly increases out-of-band. This concept is illustrated in FIG. 4A where a low power signal spectrum 180 is plotted against a quantization noise spectrum 182 for a noise-shaped Delta-Sigma ADC. The Delta-Sigma ADC pushes quantization noise toward higher frequencies so that the samples from the ADC experience less quantization noise inband. The higher out-of-band quantization noise can be filtered by digital filters 150 and 152. Although FIG. 4A illustrates the quantization noise spectrum of a Delta-Sigma ADC, wireless device 100b may utilize other types of ADCs whether they are noise-shaped or not. However, wireless device 100b is well suited with a noise-shaped ADC.

If the normal bandwidth were maintained, then spectrum 180 for the received signal would include a significant amount of quantization noise. However, a reduction in the bandwidth of filters 150 and 152 produces spectrum 180. As illustrated in FIG. 4A, the reduced bandwidth of spectrum 180 results in a decrease in the amount of quantization noise included within the filtered samples Idata and Qdata, thus resulting in an improvement in the overall system performance. Although the reduction in bandwidth leads to higher distortion in the form of ICI, the increase in ICI is negligible until the input power is much higher.

The use of two thresholds (i.e., the first and second thresholds) allows for three power regimes of operation. The low power regime has been discussed above. Filtering for the high power regime (i.e., with the received signal strength is above the first threshold) is optimal when the bandwidth of the filters (i.e., filters 122 and 124 and/or digital filters 150 and 152) is adjusted to achieve zero or near-zero ICI. For example, the bandwidth of analog filters 122 and 124 may be widened to reduce the amount of droop. Alternatively or additionally, digital filters 150 and 152 may be reprogrammed with new filter coefficients to achieve low ICI. The filter coefficients may be selected to adjust the filter bandwidth and/or to equalize the phase and amplitude responses of digital filters 150 and 152 to achieve low ICI.

Figure 4B:
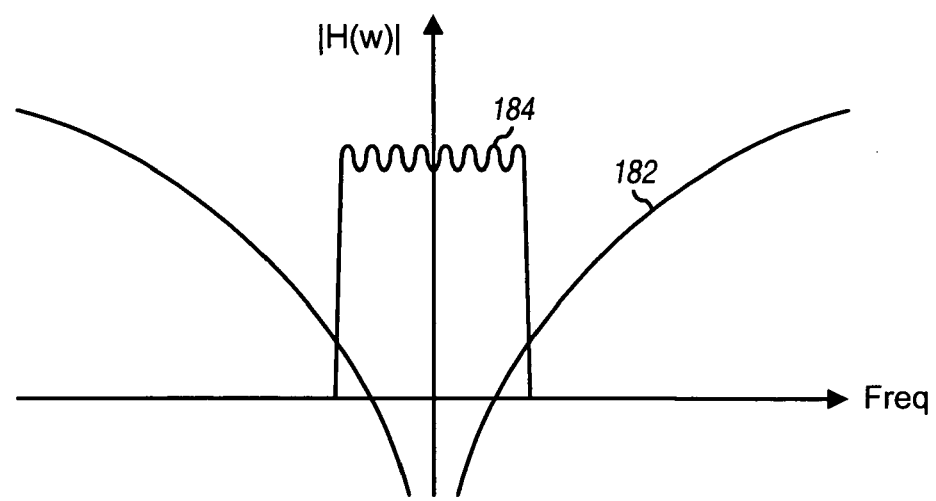

For the high power regime, allowing additional noise through the filters as a result of the wider bandwidth is not a problem since the overall noise is still typically well below the signal level. This is illustrated in FIG. 4B where a high power signal spectrum 184 is plotted against quantization noise spectrum 182. Although the example illustrated in FIG. 4B includes a greater degree of quantization noise from ADCs 130 and 132 (see FIGS. 1 and 3), the additional quantization noise is negligible when compared to the high power of the filtered signal in spectrum 184.

The intermediate power regime occurs when the received signal strength is below the first threshold and above the second threshold. In this power regime, a compromise between the noise bandwidth and the ICI is made. The bandwidth of the filters is selected for optimal operation with regard to the various sources of noise. Analog filters 122 and 124 may be tuned to the desired intermediate bandwidth and/or the filter coefficients of digital filters 150 and 152 may be selected to obtain the desired intermediate bandwidth.

In a simplified embodiment of wireless devices 100a and 100b, the first and second thresholds may be identical (i.e., a single threshold is used). In this embodiment, wireless devices 100a and 100b operate in either a high or low power regime. The filters have a narrow or reduced bandwidth in the low power regime and a wide or normal bandwidth in the high power regime. The intermediate power regime, with intermediate bandwidth filters, is eliminated in this simplified embodiment.

Since the input power is known or can be measured, it is possible to narrow the filter bandwidth at sensitivity and to increase the filter bandwidth for high input power levels. Wireless devices 100a 100b generate filter control signals (i.e., filter control signal 146 and/or 156) to adjust the bandwidth of the corresponding filter for high input power levels. Thus, overall system performance is enhanced by the additional filtering.

The filter bandwidth may be adjusted based solely on the received signal strength, as described above. The filter bandwidth may also be adjusted based on some other criterion or a combination of criteria, such as received signal strength, undesired signal strength, signal-to-noise ratio (SNR), and so on. Received signal strength is indicative of the total power (i.e., signal plus noise) of the desired signal components within the RF channel of interest. SNR is indicative of the quality of the desired signal (i.e., the desired signal divided by the noise) within the RF channel of interest. SNR may be estimated, for example, based on a received pilot. A jammer is an undesired interfering signal that is outside of the RF channel of interest and may be much higher (e.g., tens of dB higher) in amplitude than the desired signal. Received signal strength and SNR are typically measured based on the filtered signals, i.e., after the filtering at the wireless device. Jammers are typically detected based on unfiltered signals, i.e., prior to the filtering. Jammer detection may be performed on the downconverted signals from mixers 112 and 114, the received signal from antenna 104, the conditioned RF signal from RF stage 108, and so on. Jammers may be declared to be 'high' if the signal strength of the signal being measured for jammers is greater than a jammer threshold (Thj) and 'low' otherwise.

Figure 5:
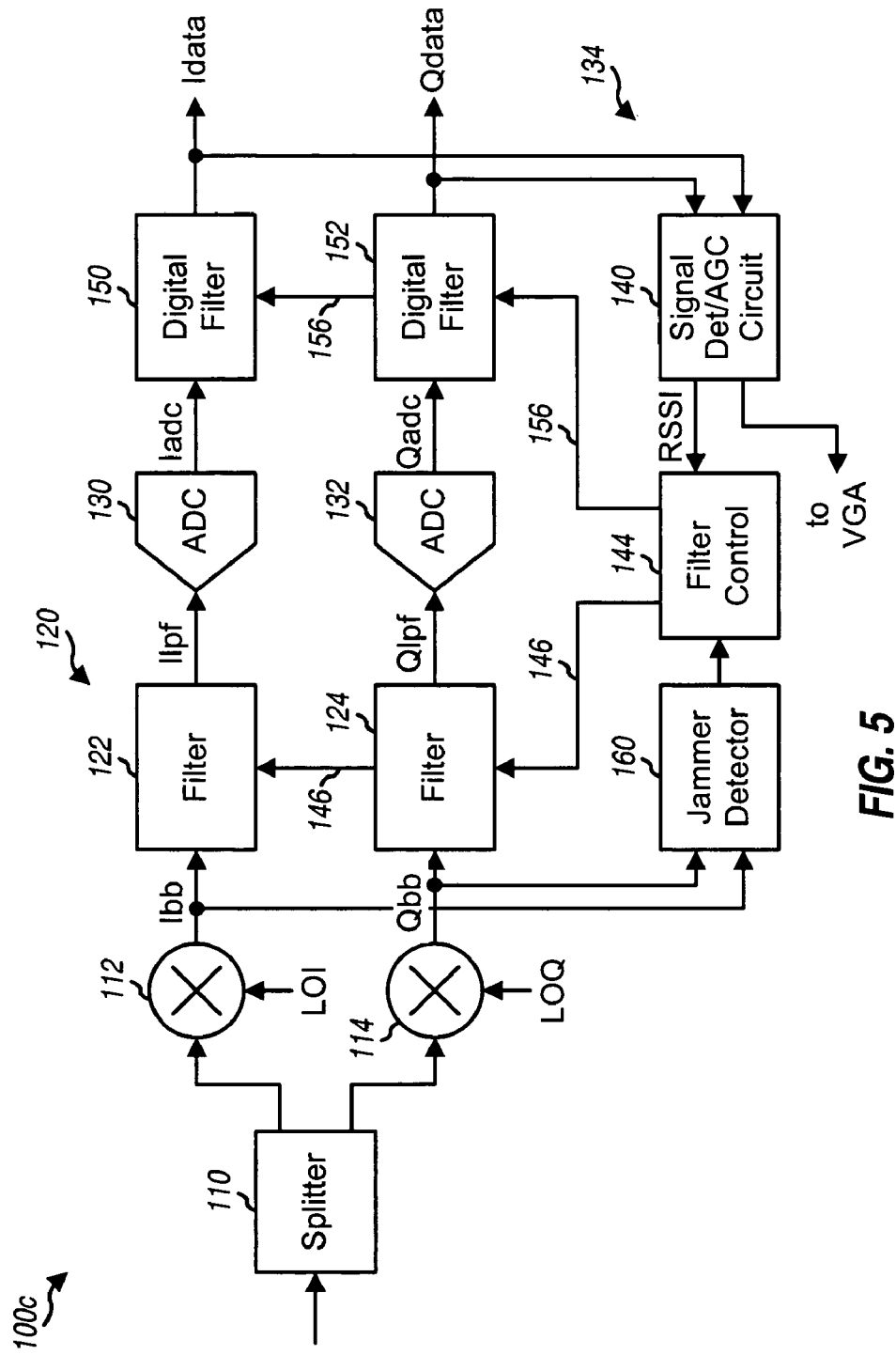
FIG. 5 shows a wireless communication device that implements yet another embodiment of the present invention.

FIG. 5 shows a block diagram of a wireless communication device 100c that implements yet another embodiment of the present invention. Wireless device 100c is similar to device 100b but further includes a jammer detector 160. For the embodiment shown in FIG. 5, jammer detector 160 receives the baseband signals from mixers 112 and 114, detects for the presence of jammers, and provides an indication of detected jammers to filter control unit 144. Jammer detector 160 may measure the signal strength of the baseband signals, compare the measured signal strength against the jammer threshold Thj, and provides an indication that jammers are present if the measured signal strength is greater than the jammer threshold Thj. Jammer detector 160 may include a lowpass filter that filters the baseband signal (or the received RF signal) and a power detector that measures the baseband power of the lowpass filter output. Jammer detector 160 may also include a highpass filter that filters the baseband signal (or the received RF signal), and the power detector also measures the baseband power of the highpass filter output. The filter, the delay unit, or both the filter and the delay unit may be adjusted based on the measured baseband power from the lowpass filter output and/or the baseband power from the highpass filter output.

Table 2 shows exemplary filter bandwidth settings for different received signal strength and jammer conditions. In general, the filter bandwidth is reduced when high amplitude jammers are detected and widened otherwise. The filter bandwidth may be set in a different manner from that shown in Table 2, and this is within the scope of the invention.

TABLE 2

| Jammer | Signal Strength | Filter Setting |
|---|---|---|
| High | Weak | Narrow |
| High | Intermediate | Narrow |
| High | Strong | Intermediate |
| Low | Weak | Normal |
| Low | Intermediate | Normal |
| Low | Strong | Normal |

Any filter, whether analog or digital, can be characterized by a frequency response that includes an amplitude response versus frequency and a phase response versus frequency. The amplitude response determines the amount of attenuation for signal components at different frequencies. The phase response determines the amount of phase shift for signal components at different frequencies, which in turn determines the amount of delay through the filter. In general, for a given filter order, a wider bandwidth corresponds to less delay and a narrow bandwidth corresponds to more delay. Furthermore, for a given bandwidth, a higher order filter has more delay than a lower order filter.

In some wireless communication systems, a wireless device may need to continually track the timing of a received signal so that the signal can be properly demodulated. For example, in a CDMA system, each BTS or base station spectrally spreads its signal with a pseudo-random number (PN) sequence prior to transmission to wireless devices. To recover the transmitted signal, a wireless device would need to perform the complementary despreading operation on the received signal with a locally-generated PN sequence that is time-aligned with the PN sequence of the received signal. The wireless device would thus need to estimate and track the timing of the received signal so that the despreading operation can be properly performed. If the timing of the received signal is not properly tracked and the PN sequence used by the wireless device is not time-aligned with that of the received signal, then the results of the despreading operation will be degraded.

A wireless device in a CDMA system typically employs a timing control loop that estimates the timing of the received signal and adjusts the timing of the locally-generated PN sequence accordingly. When analog filters 122 and 124 and/or digital filters 150 and 152 are adjusted, the delay of the filters typically changes. As a result, the filtered signals from these filters would be advanced or retarded by an amount equal to the change in the filter delay (DD). If the delta delay is sufficiently large, then performance will be degraded until the time tracking loop corrects for the change in timing.

To avoid disturbing the timing of the received signal, adjustable delay units may be provided in the signal path. These delay units can be adjusted simultaneously with the filters so that the overall delay of both the filters and the delay units is maintained approximately constant even when the filters are adjusted. The filtered signals would then appear to be stationary even after the filters are adjusted. Performance degradation is thereby minimized.

Figure 6:
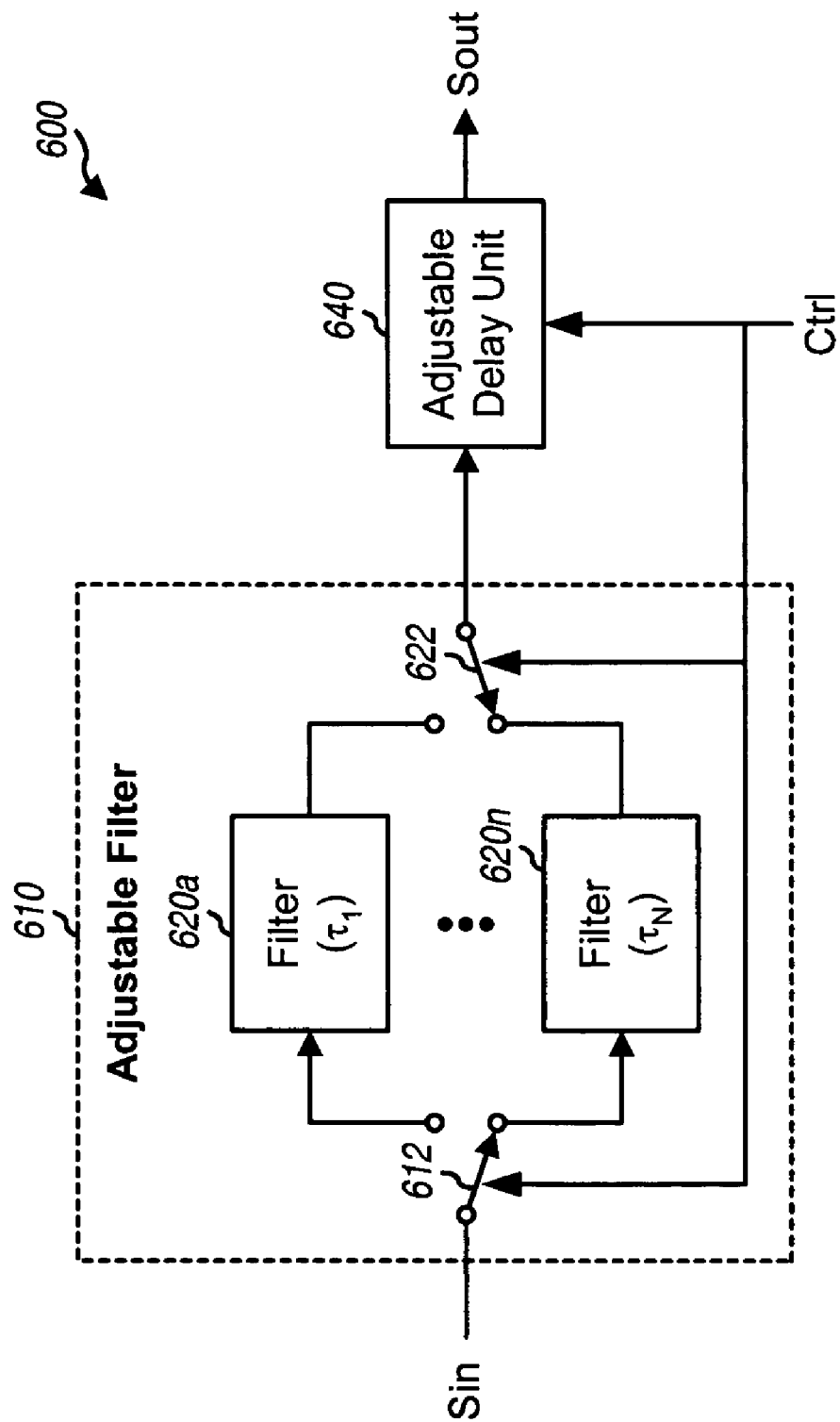
FIG. 6 shows a constant delay adjustable filter unit.

FIG. 6 shows a block diagram of an embodiment of a constant delay adjustable filter unit 600. Filter unit 600 includes an adjustable filter 610 and an adjustable delay unit 640. Adjustable filter 610 includes N filters 620a through 620n, where N can be any integer one or greater (e.g., N=1, 2, 3, and so on). Each filter 620 has a particular frequency response (e.g., bandwidth, shape, and filter order) and a particular delay ($\tau$). The N filters 620a through 620n have different frequency responses (e.g., different bandwidths and/or filter orders) and different delays $\tau_1$ through $\tau_N$, respectively. One of the N filters 620a through 620n is selected for use at any given moment by controlling switches 612 and 622. The input signal (Sin) is filtered by the selected filter, and the filtered signal is provided to adjustable delay unit 640.

Adjustable delay unit 640 provides the proper amount of delay so that the overall delay ($\tau_{total}$) for filter unit 600 is approximately constant regardless of which one of the N filters 620a through 620n is selected for use. For example, adjustable delay unit 640 may provide a delay of approximately $\tau_{total}-\tau_1$ if filter 620a is selected, a delay of approximately $\tau_{total}-\tau_2$ if filter 620b is selected, and so on, and a delay of approximately $\tau_{total}-\tau_N$ if filter 620n is selected. Typically, a small error in the overall delay can be tolerated without degrading performance. Thus, the amount of delay provided by delay unit 640 need not be exactly $\tau_{total}-\tau_i$ for filter 620i.

In an embodiment, filter unit 600 may be used for each of analog filters 122 and 124 and/or each of digital filters 150 and 152. In another embodiment, adjustable filter 610 may be used for each of analog filters 122 and 124 and/or each of digital filters 150 and 152. For this embodiment, adjustable delay unit 640 can be implemented as a separate unit along the signal path.

Figure 7:
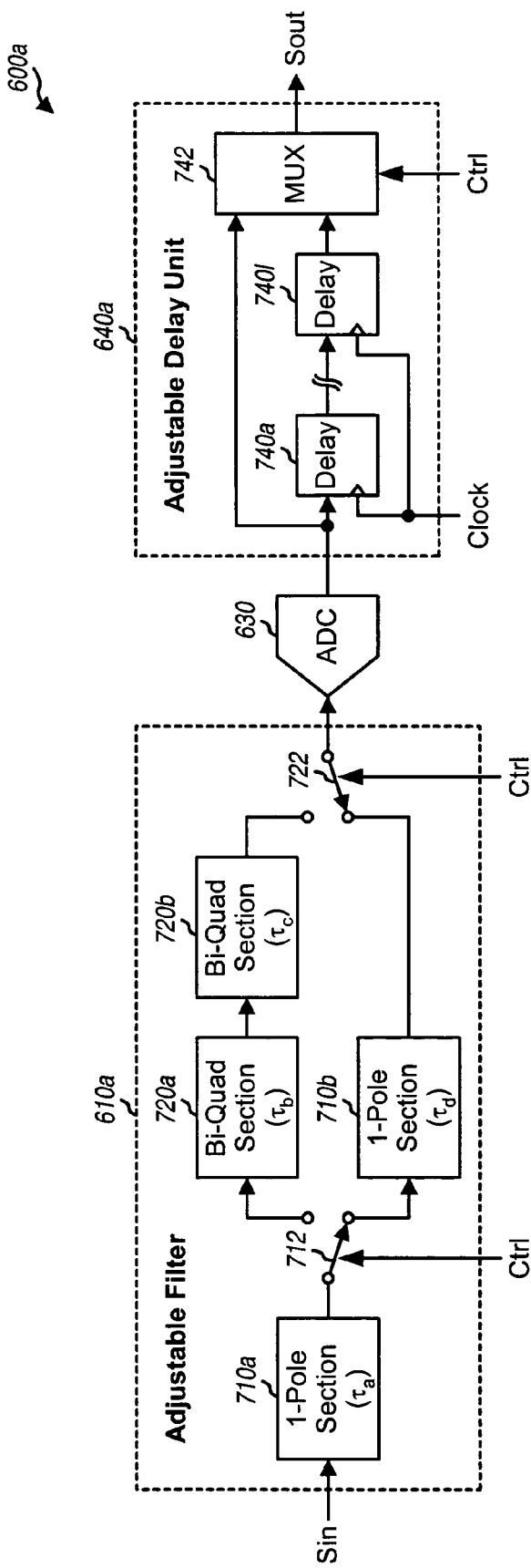
FIG. 7 shows the constant delay filter unit implemented with an analog adjustable filter and a digital adjustable delay unit.

FIG. 7 shows an embodiment of a constant delay adjustable filter unit 600a, which is implemented with an analog adjustable filter 610a and a digital adjustable delay unit 640a. An ADC 630 (which may be ADC 130 or 132) is located between adjustable filter 610a and adjustable delay unit 640a.

For the embodiment shown in FIG. 7, adjustable filter 610a includes single-pole filter sections 710a and 710b and bi-quad filter sections 720a and 720b. Each single-pole filter section 710 implements one real pole. Each bi-quad filter section 720 implements a pair of complex poles. A 5-th order (e.g., elliptical, Butterworth, Bessel, or Chebychev) filter may be implemented with single-pole section 710a and bi-quad sections 720a and 720b. A 2-nd order filter with two real poles may be implemented with single-pole sections 710a and 710b. Switches 712 and 722 are used to select between the 5-th order filter and the 2-nd order filter.

For the embodiment shown in FIG. 7, adjustable delay unit 640a includes L registers 740a through 740l and a multiplexer (MUX) 742, where L is determined by the required amount of delay and the frequency (fclk) of the clock used for registers 740. Registers 740a through 740l couple in series and are triggered by the clock (e.g., a Chipx8 clock, which has a frequency that is eight times the chip rate). Multiplexer 742 receives the input of register 740a and the output of register 740l and provides one of these inputs as the output signal (Sout).

The 5-th order filter has a total delay equal to the sum of the delays of sections 710a, 720a and 720b, which is $\tau_{5th} = \tau_a + \tau_b + \tau_c$. The 2-th order filter has a total delay equal to the sum of the delays of sections 710a and 710b, which is $\tau_{2nd} = \tau_a + \tau_d$. Adjustable delay unit 640a provides a delay of approximately $\tau_{total} - \tau_{5th}$ (e.g., 0 nsec) when the 5-th order filter is selected and a delay of approximately $\tau_{total} - \tau_{2nd}$ (e.g., L/fclk) when the 2-nd order filter is selected.

FIG. 7 shows an embodiment of adjustable filter 610 and adjustable delay unit 640 in FIG. 6. In general, adjustable filter 610 may be implemented with an analog or digital design. For an analog design, adjustable filter 610 may be implemented with switch capacitors, gm-C, and so on, which are known in the art. For a digital design, adjustable filter 610 may be implemented with a finite impulse response (FIR) filter or an infinite impulse response (IIR) filter having a frequency response (e.g., bandwidth and delay) that can be adjusted with a set of filter coefficients. Similarly, adjustable delay unit 640 may be implemented with an analog or digital design. For an analog design, adjustable delay unit 640 may be implemented as an all-pass filter with the desired delay determined by proper placement of complex poles. For a digital design, adjustable delay unit 640 may be implemented with registers, as shown in FIG. 7. A digital filter may also be designed such that the bandwidth can be adjusted while the delay is maintained approximately constant.

For clarity, the filtering techniques have been described below for a wireless communication device, which may also be referred to as a mobile station, a user terminal, a cellular phone, a user equipment, and so on. These techniques may also be used for a BTS, which may also be referred to as a base station, and access point, and so on.

It is to be understood that even though various embodiments and advantages of the present invention have been set forth in the foregoing description, the above disclosure is illustrative only, and changes may be made in detail, yet remain within the broad principles of the invention. Therefore, the present invention is to be limited by the appended claims.

What is claimed is:

1. A wireless device comprising:
   a filter operative to filter a baseband signal and provide a filtered signal, the filter having an adjustable frequency response based at least in part on a signal strength of the baseband signal, a bandwidth of the filter is reduced if the signal strength of the baseband signal is below a threshold; and
   a delay unit operative to delay the filtered signal and provide an output signal, the delay unit providing an adjustable delay determined and adjustable based on the signal strength of the baseband signal as measured in the wireless device.

2. The wireless device of claim 1, wherein the delay of the delay unit is adjusted to maintain an approximately constant overall delay for the filter and the delay unit when the frequency response of the filter is adjusted.

3. The wireless device of claim 1, wherein the frequency response of the filter and the delay of the delay unit are adjusted simultaneously to maintain timing of the output signal approximately fixed when the filter and the delay unit are adjusted.

4. The wireless device of claim 1, further comprising:
   a radio frequency (RF) unit operative to process a received signal and provide the baseband signal.

5. The wireless device of claim 1, wherein the filter is implemented with analog circuitry.

6. The wireless device of claim 5, wherein the filter includes a plurality of filter sections, and wherein designated ones of the filter sections are selected to adjust the frequency response of the filter.

7. The wireless device of claim 1, wherein the filter is implemented with digital circuitry.

8. The wireless device of claim 7, wherein the filter response is adjusted by changing coefficients of the filter.

9. The wireless device of claim 1, wherein the delay unit is implemented with digital circuitry.

10. The wireless device of claim 9, wherein the adjustable delay of the delay unit has a resolution of one period of a clock used for the delay unit.

11. The wireless device of claim 1, further comprising:
   a signal detector operative to detect a received signal strength indicative of signal strength of a received signal for the wireless device, and wherein the filter, the delay unit, or both the filter and the delay unit are adjusted based on the received signal strength.

12. The wireless device of claim 11, wherein the bandwidth of the filter is widened if the received signal strength exceeds a second threshold.

13. The wireless device of claim 11, wherein the received signal strength is detected based on the filtered signal and is indicative of signal strength of desired signal components within a selected radio frequency (RF) channel.

14. The wireless device of claim 1, further comprising:
   a jammer detector operative to detect an undesired signal strength indicative of signal strength of undesired signal components in a received signal for the wireless device, and wherein the filter, the delay unit, or both the filter and the delay unit are adjusted based on the undesired signal strength.

15. The wireless device of claim 14, wherein the jammer detector comprises
   a lowpass filter operative to filter the received signal, and
   a power detector operative to measure baseband power of an output from the lowpass filter to obtain the undesired signal strength.

16. The wireless device of claim 14, wherein the jammer detector comprises
   a highpass filter operative to filter the received signal, and
   a power detector operative to measure baseband power of an output from the highpass filter to obtain the undesired signal strength.

17. The wireless device of claim 14, wherein the jammer detector comprises
   a lowpass filter operative to filter the received signal,
   a highpass filter operative to filter the received signal, and
   a power detector operative to measure baseband power of an output from the lowpass filter and to measure baseband power of an output from the highpass filter, and wherein the filter, the delay unit, or both the filter and the delay unit are adjusted based on the measured baseband power from the lowpass filter output and the baseband power from the highpass filter output.

18. The wireless device of claim 14, wherein a bandwidth of the filter is reduced if the undesired signal strength exceeds a predetermined threshold and widened if the undesired signal strength is below the predetermined threshold.

19. The wireless device of claim 14, wherein the undesired signal strength is indicative of signal strength of out-of-band signal components outside of a selected radio frequency (RF) channel.

20. The wireless device of claim 1, further comprising:
an analog-to-digital converter (ADC) operative to digitize the filtered signal and provide samples, and wherein the delay unit is operative to delay the samples from the ADC.

21. The wireless device of claim 20, wherein the ADC is a Delta-Sigma ADC having spectrally shaped quantization noise.

22. The wireless device of claim 1 and operable in a code division multiple access (CDMA) communication system.

23. A method of performing filtering in a wireless communication device, comprising:
filtering a baseband signal with an adjustable frequency response based at least in part on a signal strength of the baseband signal to obtain a filtered signal, a bandwidth of the filter is reduced if the signal strength of the baseband signal is below a threshold; and
delaying the filtered signal with an adjustable delay determined and adjustable based on the signal strength of the baseband signal as measured in the wireless device to obtain an output signal.

24. The method of claim 23, wherein the delaying the filtered signal comprises delaying the filtered signal with an adjustable delay to maintain an approximately constant overall delay for the output signal when the frequency response is adjusted.

25. The method of claim 23, wherein the frequency response and the delay are adjusted simultaneously to maintain timing of the output signal approximately fixed.

26. The method of claim 23, further comprising:
processing a received signal to obtain the baseband signal.

27. The method of claim 23, further comprising:
digitizing the filtered signal to obtain samples, and wherein the samples are delayed by the adjustable delay.

28. The method of claim 23, further comprising:
detecting a desired signal strength indicative of signal strength of desired signal components in a received signal, and wherein the frequency response and delay are adjusted based on the desired signal strength.

29. The method of claim 23, further comprising:
detecting signal strength of jammers in a received signal, and wherein the frequency response and delay are adjusted based on the signal strength of the jammers.

30. An apparatus in a wireless communication system, comprising:
means for filtering the baseband signal with an adjustable frequency response based at least in part on a signal strength of the baseband signal to obtain a filtered signal, a bandwidth of the filter is reduced if the signal strength of the baseband signal is below a threshold; and
means for delaying the filtered signal with an adjustable delay determined and adjustable based on the signal strength of the baseband signal as measured in the apparatus to obtain an output signal.

31. The apparatus of claim 30, wherein the delay is adjusted to maintain an approximately constant overall delay for the output signal when the frequency response is adjusted.

32. The apparatus of claim 30, wherein the frequency response and the delay are adjusted simultaneously to maintain timing of the output signal approximately fixed.

33. The apparatus of claim 30, further comprising:
means for processing a received signal to obtain the baseband signal.

34. The apparatus of claim 30, further comprising:
means for digitizing the filtered signal to obtain samples, and wherein the samples are delayed by the adjustable delay.

35. The apparatus of claim 30, further comprising:
means for detecting a desired signal strength indicative of signal strength of desired signal components in a received signal, and wherein the frequency response and delay are adjusted based on the desired signal strength.

36. The apparatus of claim 30, further comprising:
means for detecting signal strength of jammers in a received signal, and wherein the frequency response and delay are adjusted based on the signal strength of the jammers.

37. The apparatus of claim 30 and operable in a code division multiple access (CDMA) communication system.

38. A wireless device in a code division multiple access (CDMA) communication system, comprising:
a radio frequency (RF) unit operative to process a received signal and provide a baseband signal;
a filter operative to filter the baseband signal and provide a filtered signal, the filter having an adjustable bandwidth based at least in part on a signal strength of the baseband signal;
a detector operative to detect the filtered signal and provide a desired signal strength indicative of signal strength of desired signal components in the received signal;
a control unit operative to adjust the bandwidth of the filter to a first bandwidth if the desired signal strength is above a first threshold and to a second bandwidth less than the first bandwidth if the desired signal strength is below a second threshold; and
a delay unit operative to delay the filtered signal and provide an output signal, the delay unit providing an adjustable delay determined and adjustable based on the desired signal strength of the baseband signal as measured in the wireless device.

39. The wireless device of claim 38, further comprising:
an analog-to-digital converter (ADC) operative to digitize the filtered signal and provide samples, the ADC having spectrally shaped quantization noise, and wherein the detector is operative to detect the desired signal strength based on the samples.

40. The wireless device of claim 38, wherein the delay of the delay unit is adjusted to maintain an approximately constant overall delay for the filter and the delay unit when the bandwidth of the filter is adjusted.

41. A method of processing a received signal at a wireless device, comprising:
processing the received signal to obtain a baseband signal;
filtering the baseband signal with an adjustable bandwidth to obtain a filtered signal;
detecting the filtered signal to determine a signal strength of the received signal;
adjusting the bandwidth of a filter to a first bandwidth if the signal strength is above a first threshold and to a second bandwidth less than the first bandwidth if the signal strength is below a second threshold; and delaying the filtered signal with an adjustable delay determined and adjustable based on the signal strength of the filtered signal as measured in the wireless device to obtain an output signal.

42. An apparatus in a wireless communication device, comprising:

means for processing the received signal to obtain a baseband signal;

means for filtering the baseband signal with an adjustable bandwidth to obtain a filtered signal;

means for detecting the filtered signal to determine a signal strength of the received signal;

means for adjusting the bandwidth of a filter to a first bandwidth if the signal strength is above a first threshold and to a second bandwidth less than the first bandwidth if the signal strength is below a second threshold; and means for delaying the filtered signal with an adjustable delay determined and adjustable based on the signal strength of the filtered signal as measured in the wireless device to obtain an output signal.

* * * * *